United States Patent
Ding et al.

(10) Patent No.: US 9,319,001 B2
(45) Date of Patent: Apr. 19, 2016

(54) AMPLIFIER CIRCUIT, BIASING BLOCK WITH OUTPUT GAIN COMPENSATION THEREOF, AND ELECTRONIC APPARATUS

(71) Applicant: ADVANCED SEMICONDUCTOR ENGINEERING INC., Kaohsiung (TW)

(72) Inventors: Jaw-Ming Ding, Taoyuan County (TW); Rong-Hsang Ho, Taipei (TW); Jia-Hong Mou, Keelung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 89 days.

(21) Appl. No.: 14/187,823

(22) Filed: Feb. 24, 2014

(65) Prior Publication Data
US 2015/0244327 A1    Aug. 27, 2015

(51) Int. Cl.
   *H03F 1/38* (2006.01)
   *H03F 1/30* (2006.01)
   *H03F 3/193* (2006.01)

(52) U.S. Cl.
   CPC ................ *H03F 1/301* (2013.01); *H03F 3/193* (2013.01); *H03F 2200/18* (2013.01); *H03F 2200/447* (2013.01); *H03F 2200/451* (2013.01)

(58) Field of Classification Search
   CPC .................................................. H03F 2200/18

USPC .......................... 330/291, 310, 311, 277, 296
See application file for complete search history.

(56) References Cited

U.S. PATENT DOCUMENTS

| | | | |
|---|---|---|---|
| 7,911,279 B2 * | 3/2011 | Chow et al. | 330/311 |
| 2006/0284684 A1 | 12/2006 | Baree et al. | |
| 2009/0153248 A1 | 6/2009 | Sun et al. | |

FOREIGN PATENT DOCUMENTS

| | | |
|---|---|---|
| CN | 101288226 A | 10/2008 |
| TW | 200937852 | 12/2008 |

\* cited by examiner

*Primary Examiner* — Khanh V Nguyen
*Assistant Examiner* — Khiem Nguyen
(74) *Attorney, Agent, or Firm* — Foley & Lardner LLP; Cliff Z. Liu; Angela D. Murch

(57) ABSTRACT

An exemplary embodiment of the present disclosure illustrates an amplifier circuit comprising an amplifier block and a biasing block. The amplifier block is used to receive an input signal and amplify the input signal to generate an output signal. The a biasing block coupled to the amplifier block is used to provide biasing voltages to bias the amplifier block, and compensate an output gain of the amplifier block before the output gain of the amplifier block is compressed, so as to extend a P1 dB compression point of the amplifier block, wherein the biasing currents are substantially independent to temperature and/or system voltage variation.

16 Claims, 4 Drawing Sheets

AMPLIFIER CIRCUIT, BIASING BLOCK WITH OUTPUT GAIN COMPENSATION THEREOF, AND ELECTRONIC APPARATUS

BACKGROUND

1. Technical Field

The present disclosure relates to an amplifier, in particular, to an amplifier circuit having a biasing block with output gain compensation, and an electronic apparatus using the amplifier circuit.

2. Description of Related Art

Amplifier circuits are widely used in the electronic apparatuses of various kinds, such as radio frequency (RF) communication apparatuses. One of the amplifier circuits has a cascode low noise amplifier (LNA). The cascode LNA has higher input-output isolation, low noise figure and high gain.

The cascode LNA generally has two N-type metal-oxide-semiconductor field-effect transistors (NMOSFETs), wherein the two NMOSFETs are cascaded with each other. One of the two NMOSFETs is operating as a common source amplifier, while the other one of the two NMOSFETs is operating as a common gate amplifier. The cascode LNA improves the input-output isolation (or the reverse transmission) as there is no direct coupling from the output to the input of the cascode LNA, thus eliminating Miller effect and contributing to a much higher isolation. Moreover, at least one source degenerator circuit can be coupled to the cascode LNA for the input and/or output impedance matching.

However, when a radio frequency signal input to the cascode LNA increases, a load line of the cascode LNA may enter a saturation region due to nonlinear characteristics of the cascode LNA. Thus, the output gain of the cascode LNA is compressed, the output power of the cascode LNA is saturated, and the harmonic distortion is caused. In addition, the cascode LNA should be coupled to a biasing circuit to receive biasing voltages, such that the biasing current may not be changed due to the temperature and/or system voltage variation.

SUMMARY

An exemplary embodiment of the present disclosure provides an amplifier circuit comprising an amplifier block and a biasing block. The amplifier block is used to receive an input signal and amplify the input signal to generate an output signal. The biasing block coupled to the amplifier block is used to provide biasing voltages to bias the amplifier block, and compensate an output gain of the amplifier block before the output gain of the amplifier block is compressed, so as to extend a P1 dB compression point of the amplifier block, wherein the biasing current are substantially independent to temperature and/or system voltage variation.

An exemplary embodiment of the present disclosure provides a biasing block with output gain compensation for an amplifier circuit, wherein an amplifier block is used to receive an input signal, and amplify the input signal to generate an output signal, and the biasing block coupled to the amplifier block comprises a DC biasing circuit and an output gain compensation circuit. The DC biasing circuit coupled to the amplifier block is used to provide partial of biasing voltages to bias the amplifier block, wherein the biasing current are substantially independent to temperature and/or system voltage variation. The output gain compensation circuit coupled to the amplifier block and the DC biasing circuit is used to receive partial of the biasing voltages and a feedback signal related to the output signal, wherein when input power of the input signal increases to a specific level, the feedback signal indicates the output gain compensation circuit to compensate an output gain of the amplifier block before the output gain of the amplifier block is compressed, so as to extend a P1 dB compression point of the amplifier block.

An exemplary embodiment of the present disclosure provides an electronic apparatus comprising at least one function circuit and the foregoing amplifier circuit coupled to the least one function circuit.

To sum up, the amplifier circuit provided by the exemplary embodiment of the present disclosure has the biasing block to provide biasing current little affected by the temperature and/or system voltage variation to the amplifier block (i.e. compensation of the temperature and/or system voltage variation), and further to compensate the output gain compression.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
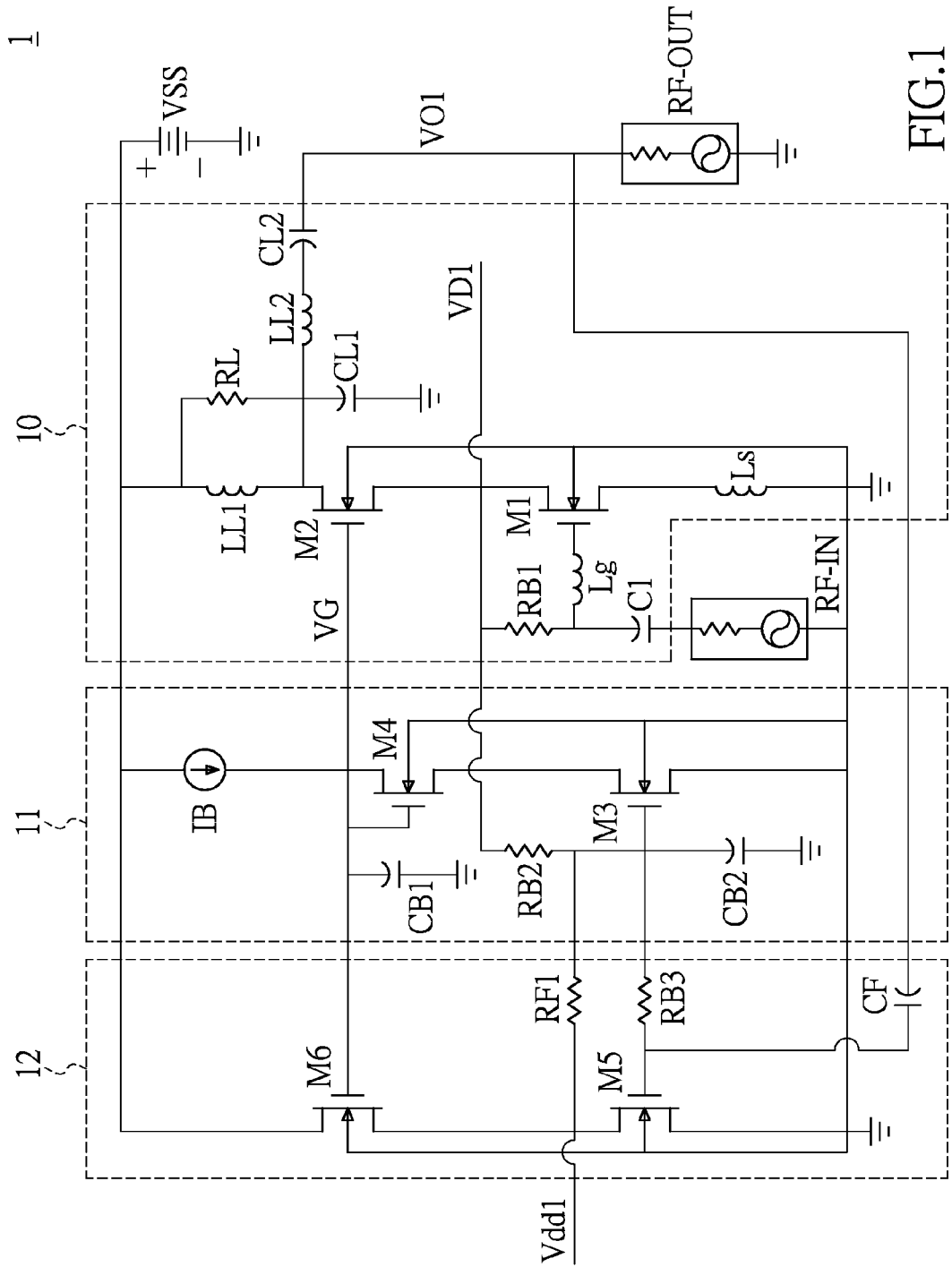
FIG. 1 is a circuit diagram of an amplifier circuit according to an exemplary embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

Exemplary embodiments of the present disclosure provide amplifier circuits. The amplifier circuit comprises a biasing block and an amplifier block with output gain compensation, wherein the biasing block is coupled to the amplifier block. The biasing block can provide stable biasing current not affected by the temperature and/or system voltage variation, and further compensate the output gain of the amplifier block.

To put it concretely, the biasing block comprises a direct current (DC) biasing circuit and an output gain compensation circuit, wherein the output gain compensation circuit is coupled to the DC biasing circuit and the amplifier block, and the DC biasing circuit is coupled to the amplifier block. In one exemplary embodiment of the present disclosure, the DC biasing circuit may have two transistors, such as two NMOSFETs, the amplifier block may have two transistors, such as two NMOSFETs, and the above mentioned four transistors form a Wilson current mirror. In another one exemplary embodiment of the present disclosure, the DC biasing circuit may have four transistors, such as four NMOSFETs, to form a Wilson current mirror. The Wilson current mirror is used to provide the biasing voltages to the output gain compensation circuit and the amplifier block, wherein the biasing currents are little affected by the temperature and/or system voltage variation.

The output gain compensation circuit may have two transistors, such as two NMOSFETs, wherein a control terminal of the one transistor, such as a gate of the one NMOSFET, is used to receive a feedback signal related to an output signal of the amplifier block. When the input power of the input signal is increased to a specific level, for example −20 dBm, the feedback signal received by the output gain compensation circuit is increased, and the output gain compensation circuit compensates the output gain of the amplifier block, thus extending the P1 dB compression point (p.s. P1 dB is used to indicate the input power level that causes the output gain to drop by 1 dB from its small signal value).

It is noted that, the output gain compensation circuit pulls lower a voltage on a control terminal of the one transistor (such as a gate of the one NMOSFET) in the DC biasing circuit, and thus a current flowing through the one transistor in the DC biasing circuit is decreased. Since the current flowing through the one transistor in the DC biasing circuit is constant, a voltage on a control terminal of the one transistor (such as a gate of the one NMOSFET) in the amplifier block is raised. Accordingly, a current flowing through the one transistor in the amplifier block is increased, and the output gain of the amplifier block is compensated to extend the 1 dB compression point.

Referring to FIG. 1, FIG. 1 is a circuit diagram of an amplifier circuit according to an exemplary embodiment of the present disclosure. The amplifier circuit 1 comprises an amplifier block 10 and a biasing block with output gain compensation, wherein the biasing block comprises a DC biasing circuit 11 and an output gain compensation circuit 12. The biasing block is coupled to the amplifier block 10.

The amplifier block 10 receives an input signal from a signal source RF-IN, such as a radio frequency (RF) input signal from a RF antenna, and amplifies the input signal to generate an output signal VO1 to an output load RF-OUT, such as a RF output signal to a back-end processing circuit, wherein an output gain can be a ratio of the output signal VO1 to the input signal. The amplifier block 10 can be a cascode LNA, but the present disclosure however is not limited thereto.

The biasing block provides the biasing voltages to the amplifier block 10, wherein the biasing currents are little affected by the temperature and/or system voltage variation. The biasing block further receives a feedback signal relative to the output signal VO1. When the input power of the input signal increases to a specific level, the feedback signal indicates the biasing block to compensates the output gain of the amplifier block 10 (i.e. for example less than 1 dB increment), such that the 1 dB compression point is extended.

The implementation details of the amplifier block 10 and the biasing block with gain compensation are illustrated as follows, but the present disclosure is however not limited thereto.

The amplifier block 10 comprises a first NMOSFET M1, a second NMOSFET M2, an input matching network, and an output matching network, wherein the first NMOSFET M1 and the second NMOSFET M2 are cascode with each other (i.e. a drain of the first NMOSFET M1 is coupled to a source of the second NMOSFET M2), the first NMOSFET M1 is coupled to the input matching network to receive the input signal from the signal source RF-IN, and the second NMOSFET M2 is coupled to the output matching network to transmit the output signal VO1 to the output load RF-OUT.

The input matching network and the output matching network are used to isolate the biasing voltages (i.e. large signals) from the input signal and the output signal VO1 (i.e. small signals), and to perform input and output impedance matching. The implementation details of input matching network and the output matching network are illustrated as follows, but the present disclosure however is not limited thereto.

The input matching network comprises a first resistor RB1, a gate inductor Lg, a first capacitor C1, and a source inductor Ls. One end of the first capacitor C1 is coupled to the input signal source RF-IN, and another one end of the first capacitor C1 is coupled to one end of the gate inductor Lg and one end of the first resistor RB1. Another one end of the first resistor RB1 is coupled to the drain of the first NMOSFET M1, and another end of the gate inductor Lg is coupled to a gate of the first NMOSFET M1. One end of the source inductor Ls is coupled to a source of the first NMOSFET M1, and another one end of the source inductor Ls is grounded.

The output matching network comprises a first load inductor LL1, a second load inductor LL2, a first load capacitor CL1, a second load capacitor CL2, and a load resistor RL. One end of the load first inductor LL1 is used to receive the system voltage VSS, and another one end of the first load inductor LL1 is coupled to a drain of the second NMOSFET M2. One end of the load resistor RL is used to receive the system voltage VSS, and another one end of the load resistor RL is coupled to the drain of the second NMOSFET M2, one end of the second load inductor LL2, and one end of the first load capacitor CL1. Another one end of the second load inductor LL2 is coupled to one end of the second load capacitor CL2, another one end of the first load capacitor CL1 is grounded, and another one end of the second load capacitor CL2 is coupled to the output load RF-OUT.

The DC biasing circuit 11 comprises a third NMOSFET M3, a fourth NMOSFET M4, a first biasing capacitor CB1, a second biasing capacitor CB2, a second resistor RB2, and a constant current source IB. A drain of the fourth NMOSFET M4 is coupled to the constant current source IB to receive a constant current. A gate of the fourth NMOSFET M4 is coupled to the drain of the fourth NMOSFET M4, the gate of the second NMOSFET M2, and one end of the first biasing capacitor CB1. Another one end of the first biasing capacitor CB1 is grounded. A source of the fourth NMOSFET M4 is coupled to a drain of the third NMOSFET M3. One end of the second resistor RB2 is coupled to a gate of the third NMOSFET M3 and one end of the second biasing capacitor CB2, and another one end of the second biasing capacitor CB2 and a source of the third NMOSFET M3 are grounded.

It is noted that, based upon the above configuration, the first NMOSFET M1 through the fourth NMOSFET M4 form a Wilson current mirror. The ratio of the channel length to the channel width (L/W) associated with the third NMOSFET M3 can be the same as those associated with the second NMOSFET M2 through the fourth NMOSFET M4. By forming the Wilson current mirror, the effect which the temperature and/or system voltage variation affects the biasing current (generated by the biasing voltages applied to the gate of the first and second NMOSFETs M1, M2, such as the voltage VG) flowing through the first and second NMOSFETs M1, M2 can be compensated. When the system voltages VSS changes from 2.5V to 3V, the deviation of the biasing current is about ±0.2%; when the temperature changes from −55° C. to 125° C., the deviation of the biasing current is about ±0.04%.

The output gain compensation circuit 12 comprises a fifth NMOSFET M5, a sixth NMOSFET M6, a feedback resistor RF1, a third resistor RB3, and a feedback capacitor CF. One end of the feedback resistor RF1 is coupled to the gate of third NMOSFET M3, and another one end of the feedback resistor RF1 is coupled to a drain of the fifth NMOSFET M5. One end of the third resistor RB3 is coupled to one end of the feedback capacitor CF and a gate of the fifth NMOSFET M5, and another one end of the third resistor RB3 is coupled to the gate of the third NMOSFET M3. Another one end of the feedback capacitor CF is coupled to the output load RF-OUT to receive the output signal VO1. A source of the fifth NMOSFET M5 is grounded, and the drain of the fifth NMOSFET M5 is coupled to a source of the sixth NMOSFET M6. A gate of the sixth NMOSFET M6 is coupled to the gate of the fourth NMOSFET M4, and a drain of the sixth NMOSFET M6 is used to receive the system voltage VSS.

It is noted that, the biasing voltages received by the gates of the first, third, and fifth NMOSFETs M1, M3, M5 are the same, and the biasing voltages received by the gates of the second, fourth, and sixth NMOSFETs M2, M4, M6 are the same, when there is no input signal feed in the amplifier block 10, or the input power of the input signal is very small (for example, less than −30 dBm). That is, the voltage VD1 on the drain of the first NMOSFET M1 and the voltage Vdd1 on the drain of the fifth NMOSFET M5 are the same, and little affected by the temperature and/or system voltage variation.

Furthermore, the fifth and sixth NMOSFETs M5 and M6 form an extra gain stage to receive the feedback signal relative to the output signal VO1. The ratios of the channel length to the channel width (L/W) associated with the fifth and sixth NMOSFETs M5 and M6 are the same as those associated with the third and fourth NMOSFETs M3 and M4. The amplifier block 10 may for example has the output gain around 19 to 20 dB, and the gain of the output gain compensation circuit 12 may be compressed earlier than the output gain of the amplifier block 10.

To put it concretely, the DC component of the voltage Vdd1 affects the biasing voltages to the first and second NMOSFETs M1, M2 through the third NMOSFET M3. When the input power of the input signal increases to a specific level (for example −20 dBm), the feedback signal affects the voltage Vdd1 through the feedback resistor RF1, and the voltage on the gate of the third NMOSFET M3 is thus pulled down. However, the biasing current flowing through the third NMOSFET M3 is constant value, such that the voltage VG on the gate of the second NMOSFET M2 is raised, and the current flowing through the first and second NMOSFETs M1 and M2 is increased to compensate the output gain of the amplifier block 10. Accordingly, the P1 dB compression point is extended.

Figure 2:
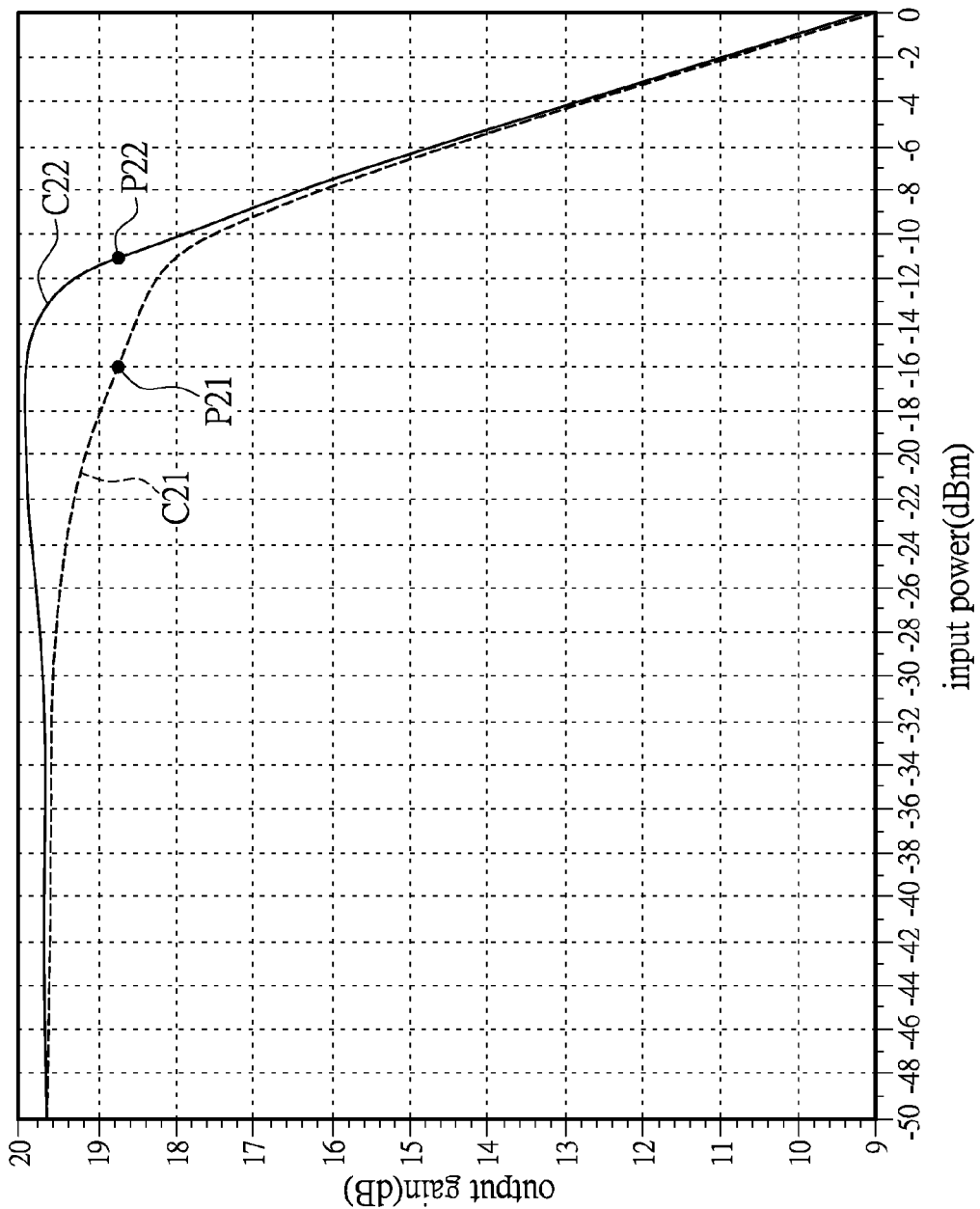
FIG. 2 is a curve diagram showing a relation of the input power of the input signal and the output gain of the amplifier circuit in FIG. 1.

Referring to FIG. 2, FIG. 2 is a curve diagram showing a relation of the input power of the input signal and the output gain of the amplifier circuit in FIG. 1. The curve C21 shows the relation of the input power of the input signal and the output gain of the amplifier circuit merely having the amplifier block 10 and the DC biasing circuit 11 (i.e. the amplifier circuit without having the output gain compensation circuit 12), and the curve C22 shows the relation of the input power of the input signal and the output gain of the amplifier circuit 1. The P1 dB compression point of the amplifier circuit without having the output gain compensation circuit 12 is located at −16 dBm input power of the input signal (see point P21 in FIG. 2), and the P1 dB compression point of the amplifier circuit 1 is located at −11 dBm input power of the input signal (see point P22 in FIG. 2) while the output gain merely has 0.5 dB through 0.8 dB increment around −30 dBm to −10 dBm input power of the input signal.

Figure 3:
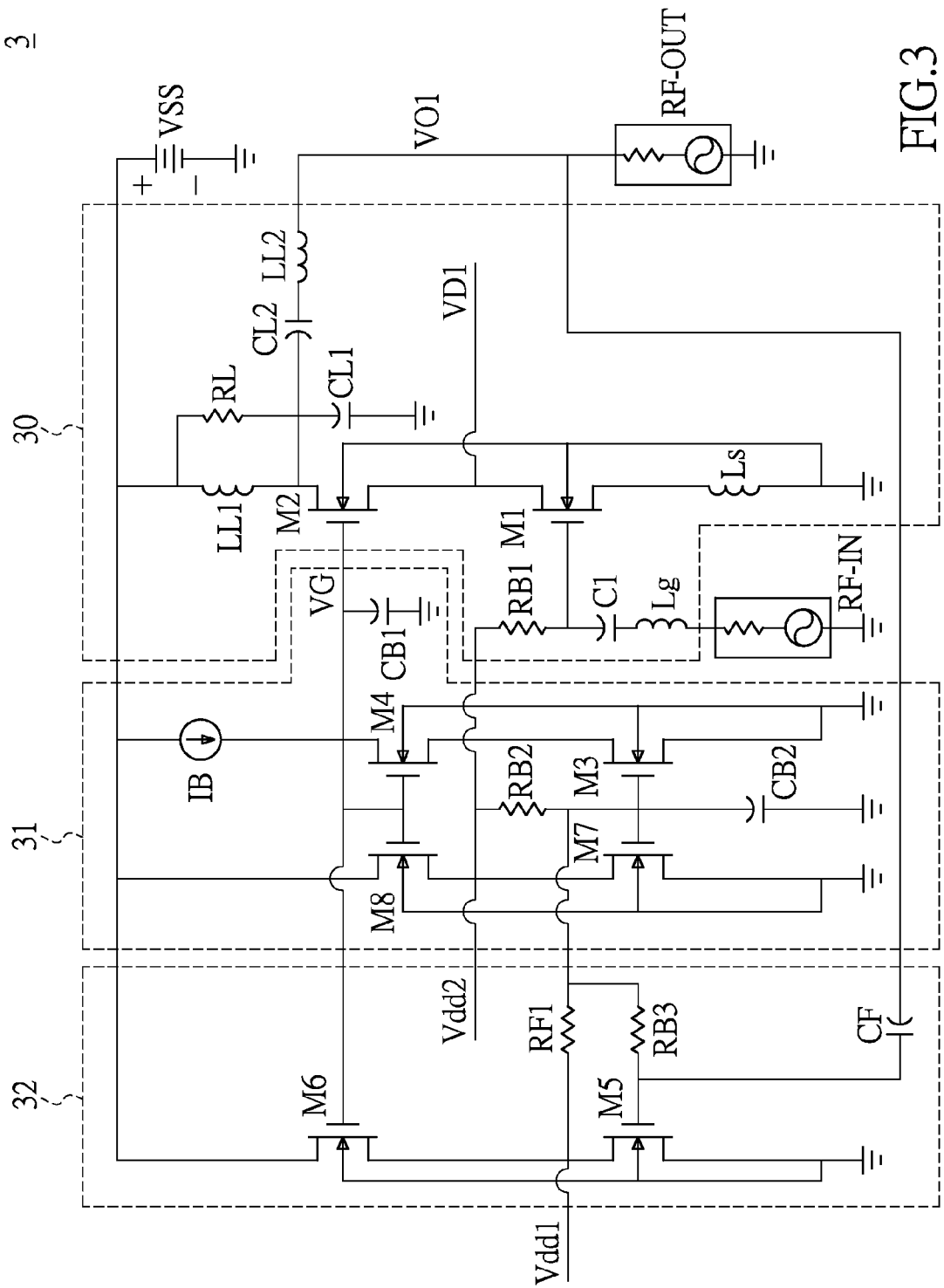
FIG. 3 is a circuit diagram of an amplifier circuit according to another one exemplary embodiment of the present disclosure.

Referring to FIG. 3, FIG. 3 is a circuit diagram of an amplifier circuit according to another one exemplary embodiment of the present disclosure. The amplifier circuit 3 comprises an amplifier block 30 and a biasing block with output gain compensation, wherein the biasing block comprises a DC biasing circuit 31 and an output gain compensation circuit 32. The biasing block is coupled to the amplifier block 30.

The amplifier block 30 and the output gain compensation circuit 32 in FIG. 3 are respectively the same as the amplifier block 10 and the output gain compensation circuit 12 in FIG. 1, while the implement details of the DC biasing circuit 31 in FIG. 3 are not the same as those of the DC biasing circuit 11 in FIG. 1. The details of the amplifier block 30 and the output gain compensation circuit 32 are omitted, and the details of the DC biasing circuit 31 are illustrated as follows.

Compared to the DC biasing circuit 11 in FIG. 1, the DC biasing circuit 31 in FIG. 3 further comprises the seventh and eighth NMOSFETs M7 and M8. A drain of the eighth NMOSFET M8 is used to receive the system voltage VSS, a gate of the eighth NMOSFET M8 is coupled to the gate of the fourth NMOSFET M4, and a source of the eighth NMOSFET M8 is coupled to a drain of the seventh NMOSFET M7. A gate of the seventh NMOSFET M7 is coupled to the gate of the third NMOSFET M3, and a source of the seventh NMOSFET M7 is grounded. Furthermore, the first resistor RB1 of the input matching network in the amplifier block 30 is not coupled to the drain of the first NMOSFET M1. Therefore, in the exemplary embodiment, the third, fourth, seventh, eighth NMOSFETs M3, M4, M7, and M8 form the Wilson current mirror to provide the biasing currents little affected by the temperature and system voltage variation to the first, second, fifth, sixth NMOSFETs M1, M2, M5, and M6.

It is noted that, the biasing voltages received by the gates of the first, fifth, NMOSFETs M1, M5 are the same, and the biasing voltages received by the gates of the second and sixth NMOSFETs M2, M6 are the same, when there is no input signal feed in the amplifier block 30, or the input power of the input signal is very small (for example, less than −30 dBm). That is, the voltage VD1 on the drain of the first NMOSFET M1, the voltage Vdd1 on the drain of the fifth NMOSFET M5, and the voltage Vdd2 on the drain of the seventh NMOSFET M7 are the same, and little affected by the temperature and/or system voltage variation.

It is noted that, the details of the gain compensation in the exemplary embodiment are the same as those described above, and thus the repeated descriptions are omitted.

Figure 4:
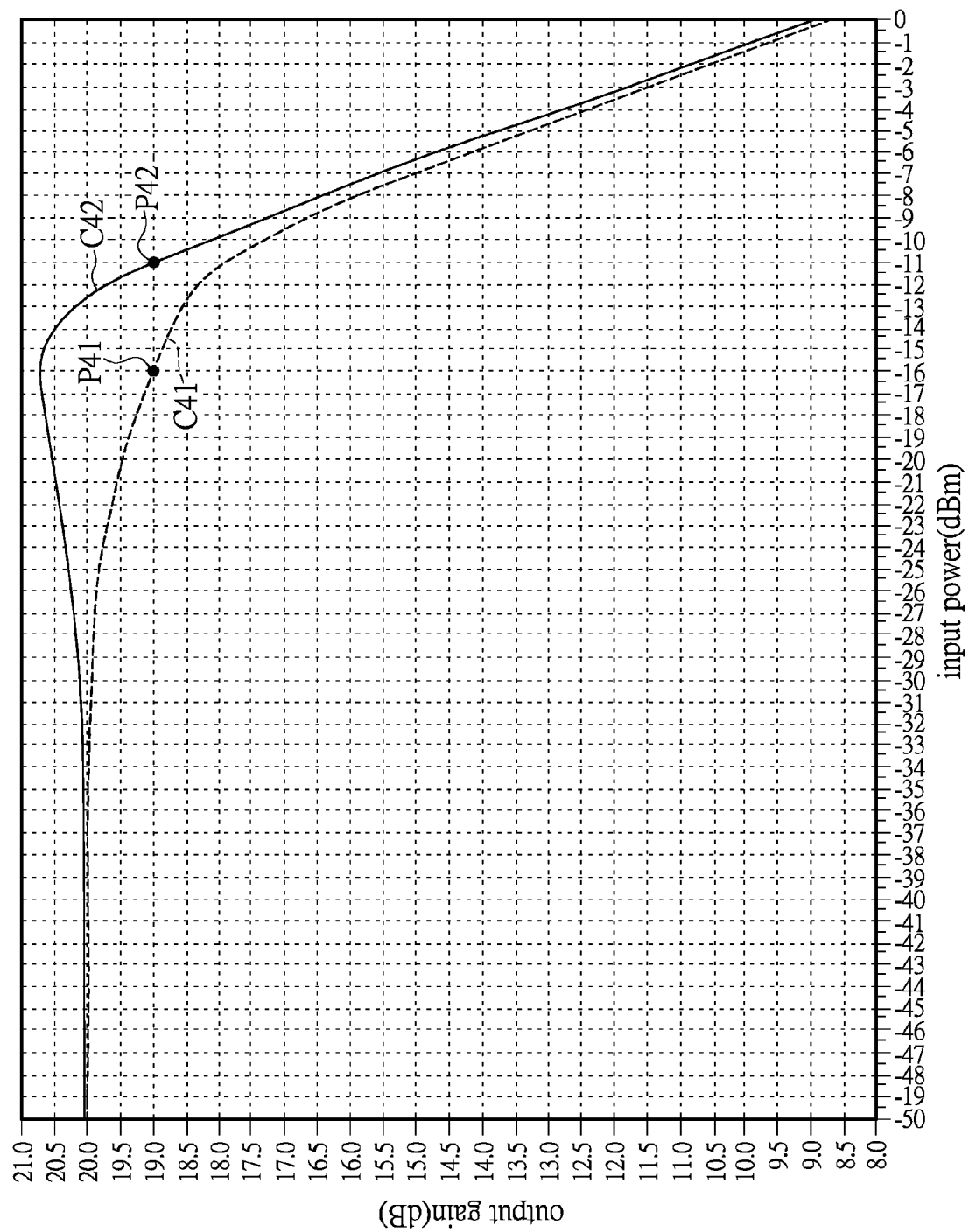
FIG. 4 is a curve diagram showing a relation of the input power of the input signal and the output gain of the amplifier circuit in FIG. 3.

Referring to FIG. 4, FIG. 4 is a curve diagram showing a relation of the input power of the input signal and the output gain of the amplifier circuit in FIG. 3. The curve C41 shows the relation of the input power of the input signal and the output gain of the amplifier circuit merely having the amplifier block 30 and the DC biasing circuit 31 (i.e. the amplifier circuit without having the output gain compensation circuit 32), and the curve C42 shows the relation of the input power of the input signal and the output gain of the amplifier circuit 3. The P1 dB compression point of the amplifier circuit without having the output gain compensation circuit 32 is located at −16 dBm input power of the input signal (see point P41 in FIG. 4), and the P1 dB compression point of the amplifier circuit 3 is located at −11.2 dBm input power of the input signal (see point P42 in FIG. 4) while the output gain merely has 1 dB through 2 dB increment around −20 dBm to −14 dBm input power of the input signal.

It is noted that one of the foregoing amplifier circuits can be applied in an electronic apparatus, especially a radio frequency apparatus, such as a notebook, a smartphone, or a pad. The electronic apparatus comprises one of the foregoing amplifier circuits and at least one function circuit for executing some specific functions, such as signal processing, communicating, displaying, and so on, wherein the at least one function circuit is coupled to the foregoing amplifier circuit.

To sum up, each of the amplifier circuits provided by the exemplary embodiments of the present disclosure has the biasing block to provide biasing currents little affected by the temperature and/or system voltage variation to the amplifier block (i.e. compensation of the temperature and/or system voltage variation), and further to compensate the output gain compression. In the exemplary embodiments of the present disclosure, the P1 dB compression point of the amplifier block can be extended at least 4 dBm, and the output gain increment before the output gain compress can be 1 dB to 2 dB.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. An amplifier circuit, comprising:
   an amplifier block, configured to receive an input signal, and amplify the input signal to generate an output signal; and
   a biasing block, coupled to the amplifier block, configured to provide biasing voltages to bias the amplifier block, and compensate an output gain of the amplifier block before the output gain of the amplifier block is compressed, so as to extend a P1 dB compression point of the amplifier block, wherein the biasing current are substantially independent to temperature and/or system voltage variation;
   wherein the biasing block comprises:
      a DC biasing circuit, coupled to the amplifier block, to provide the biasing voltages to bias the amplifier block; and
      an output gain compensation circuit, coupled to the amplifier block and the DC biasing circuit, to receive the biasing voltages and a feedback signal related to the output signal, wherein when an input power of the input signal increases to a specific level, the feedback signal indicates the output gain compensation circuit to compensate the output gain of the amplifier block;
   wherein the DC biasing circuit comprises four transistors to form a Wilson current mirror.

2. The amplifier circuit according to claim 1, wherein the amplifier block is a cascode LNA.

3. The amplifier circuit according to claim 1, wherein the amplifier block comprises:
   an input matching network, formed by a first resistor, a first capacitor, a source inductor, and a gate inductor;
   an output matching network, formed by a first load inductor, a second load inductor, a load resistor, a first load capacitor, and a second load capacitor;
   a first NMOSFET, wherein a gate of the first NMOSFET is configured to receive the input signal through the input matching network and is coupled to the DC biasing circuit through the input matching network, and a source of the first NMOSFET is grounded through the input matching network; and
   a second NMOSFET, wherein a source of the second NMOSFET is coupled to a drain of the first NMOSFET, a drain of the second NMOSFET is configured to output the output signal and is coupled to a system voltage through the output matching network, and a gate of the second NMOSFET is coupled to the DC biasing circuit.

4. The amplifier circuit according to claim 3, wherein the DC biasing circuit comprises:
   a constant current source;
   a first biasing capacitor;
   a second biasing capacitor;
   a second resistor;
   a third NMOSFET, wherein a gate of the third NMOSFET is coupled to the output gain compensation circuit and is grounded through the second biasing capacitor, a source of the third NMOSFET is grounded, and the second resistor is coupled between the gate of the third NMOSFET and the input matching network; and
   a fourth NMOSFET, wherein a source of the fourth NMOSFET is coupled to a drain of the third NMOSFET, a drain of fourth second NMOSFET is coupled to the constant current source and a gate of the fourth NMOSFET, and the gate of the fourth NMOSFET is grounded through the first biasing capacitor and is coupled to the output gain compensation circuit.

5. The amplifier circuit according to claim 4, wherein the output gain compensation circuit comprises:
   a feedback capacitor, configured to receive the output signal;
   a third resistor;
   a feedback resistor;
   a fifth NMOSFET, wherein a gate of the fifth NMOSFET is coupled to the third resistor and the feedback capacitor, a source of the fifth NMOSFET is grounded, a drain of the fifth NMOSFET is coupled to the feedback resistor; and
   a sixth NMOSFET, wherein a drain of the sixth NMOSFET is configured to receive the system voltage, a gate of the sixth NMOSFET is coupled to the drain of the fourth NMOSFET and the gate of the second NMOSFET, and a source of the sixth NMOSFET is coupled to the drain of the fifth NMOSFET.

6. The amplifier circuit according to claim 5, wherein the DC biasing circuit further comprises:
   a seventh NMOSFET, wherein a gate of the seventh NMOSFET is coupled to the gate of the third NMOSFET, and a source of the seventh NMOSFET is grounded; and
   an eighth NMOSFET, wherein a gate of the eighth NMOSFET is coupled to the gate of the fourth NMOSFET, a source of the eighth NMOSFET is coupled to a drain of the seventh NMOSFET, and a drain of the eighth NMOSFET is configured to receive the system voltage.

7. The amplifier circuit according to claim 5, wherein when the input power of the input signal increases to the specific level, the feedback signal affects a voltage on the drain of the fifth NMOSFET through the feedback resistor, thus a voltage on the gate of the third NMOSFET is pulled down, and a voltage on the gate of the second NMOSFET is raised, so as to compensate the output gain of the amplifier block.

8. A biasing block with output gain compensation for an amplifier circuit, wherein an amplifier block is configured to receive an input signal and amplify the input signal to generate an output signal, and the biasing block comprises:
   a DC biasing circuit, coupled to the amplifier block, to provide biasing voltages to bias the amplifier block; and an output gain compensation circuit, coupled to the amplifier block and the DC biasing circuit, to receive the biasing voltages and a feedback signal related to the output signal, wherein when an input power of the input signal increases to a specific level, the feedback signal indicates the output gain compensation circuit to compensate an output gain of the amplifier block before the output gain of the amplifier block is compressed, so as to extend a P1 dB compression point of the amplifier block; and wherein the DC biasing circuit comprises four transistors to form a Wilson current mirror.

9. The biasing block according to claim 8, wherein the amplifier block is a cascode LNA.

10. The biasing block according to claim 8, wherein a biasing current is substantially independent of temperature and/or system voltage variation.

11. A biasing block with output gain compensation for an amplifier circuit, wherein an amplifier block is configured to receive an input signal and amplify the input signal to generate an output signal, and the biasing block comprises:
 a DC biasing circuit coupled to the amplifier block, to provide biasing voltages to bias the amplifier block; and
 an output gain compensation circuit coupled to the amplifier block and the DC biasing circuit, to receive the biasing voltages and a feedback signal related to the output signal, wherein when an input power of the input signal increases to a specific level, the feedback signal indicates the output gain compensation circuit to compensate an output gain of the amplifier block before the output gain of the amplifier block is compressed, so as to extend a P1 dB compression point of the amplifier block;

wherein the amplifier block comprises:
 an input matching network, formed by a first resistor, a first capacitor, a source inductor, and a gate inductor;
 an output matching network, formed by a first load inductor, a second load inductor, a load resistor, a first load capacitor, and a second load capacitor;
 a first NMOSFET, wherein a gate of the first NMOSFET is configured to receive the input signal through the input matching network and is coupled to the DC biasing circuit through the input matching network, and a source of the first NMOSFET is grounded through the input matching network; and
 a second NMOSFET, wherein a source of the second NMOSFET is coupled to a drain of the first NMOSFET, a drain of the second NMOSFET outputs the output signal and is coupled to a system voltage through the output matching network, and a gate of the second NMOSFET is coupled to the DC biasing circuit.

12. The biasing block according to claim 11, wherein the DC biasing circuit comprises:

a constant current source;
a first biasing capacitor;
a second biasing capacitor;
a second resistor;
a third NMOSFET, wherein a gate of the third NMOSFET is coupled to the output gain compensation circuit and is grounded through the second biasing capacitor, a source of the third NMOSFET is grounded, and the second resistor is coupled between the gate of the third NMOSFET and the input matching network; and
a fourth NMOSFET, wherein a source of the fourth NMOSFET is coupled to a drain of the third NMOSFET, a drain of the fourth NMOSFET is coupled to the constant current source and a gate of the fourth NMOSFET, and the gate of the fourth NMOSFET is grounded through the first biasing capacitor and is coupled to the output gain compensation circuit.

13. The biasing block according to claim 12, wherein the output gain compensation circuit comprises:
 a feedback capacitor, configured to receive the output signal;
 a third resistor;
 a feedback resistor;
 a fifth NMOSFET, wherein a gate of the fifth NMOSFET is coupled to the third resistor and the feedback capacitor, a source of the fifth NMOSFET is grounded, a drain of the fifth NMOSFET is coupled to the feedback resistor; and
 a sixth NMOSFET, wherein a drain of the sixth NMOSFET is configured to receive the system voltage, a gate of the sixth NMOSFET is coupled to the drain of the fourth NMOSFET and the gate of the second NMOSFET, and a source of the sixth NMOSFET is coupled to the drain of the fifth NMOSFET.

14. The biasing block according to claim 13, wherein the DC biasing circuit further comprises:
 a seventh NMOSFET, wherein a gate of the seventh NMOSFET is coupled to the gate of the third NMOSFET, and a source of the seventh NMOSFET is grounded; and
 an eighth NMOSFET, wherein a gate of the eighth NMOSFET is coupled to the gate of the fourth NMOSFET, a source of the eighth NMOSFET is coupled to a drain of the seventh NMOSFET, and a drain of the eighth NMOSFET is configured to receive the system voltage.

15. The biasing block according to claim 13, wherein when the input power of the input signal increases to the specific level, the feedback signal affects a voltage on the drain of the fifth NMOSFET through the feedback resistor, thus a voltage on the gate of the third NMOSFET is pulled down, and a voltage on the gate of the second NMOSFET is raised, so as to compensate the output gain of the amplifier block.

16. The biasing block according to claim 11, wherein a biasing current is substantially independent of temperature and/or system voltage variation.

* * * * *